(12) United States Patent
Fuhrmann et al.

(10) Patent No.: US 7,082,513 B2
(45) Date of Patent: Jul. 25, 2006

(54) INTEGRATED MEMORY AND METHOD FOR CHECKING THE FUNCTIONING OF AN INTEGRATED MEMORY

(75) Inventors: Dirk Fuhrmann, München (DE); Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 347 days.

(21) Appl. No.: 10/633,996

(22) Filed: Aug. 4, 2003

(65) Prior Publication Data
US 2004/0052132 A1    Mar. 18, 2004

(30) Foreign Application Priority Data
Aug. 2, 2002    (DE)    ................................ 102 35 454

(51) Int. Cl.
*G06F 12/06* (2006.01)
(52) U.S. Cl. .................................................... 711/217
(58) Field of Classification Search ................ 711/104, 711/105, 217; 365/201; 714/718
See application file for complete search history.

(56) References Cited

U.S. PATENT DOCUMENTS

| 5,675,545 A | * | 10/1997 | Madhavan et al. | ......... | 365/211 |
| 6,321,320 B1 | | 11/2001 | Fleischman et al. | | |
| 6,651,202 B1 | * | 11/2003 | Phan | .......................... | 714/733 |
| 2003/0063517 A1 | * | 4/2003 | Jain | ....................... | 365/230.05 |
| 2003/0107937 A1 | * | 6/2003 | Williams et al. | ............. | 365/211 |

* cited by examiner

*Primary Examiner*—Kevin L. Ellis
(74) *Attorney, Agent, or Firm*—Laurence A. Greenberg; Werner H. Stemer; Ralph E. Locher (57) ABSTRACT

An integrated memory contains an addressing unit for addressing memory cells for a memory access on the basis of received addressing signals. An addressing calculation logic unit is connected to the addressing unit. The latter can be activated by a test mode signal for a test operation of the memory. The addressing calculation logic unit receives command signals and address signals for the test operation, calculates therefrom the addressing signals for the memory access and feeds the latter into the addressing unit. After an initialization with the loading of initial parameters, the command signals and address signals for the test operation are applied to the addressing calculation logic unit and read/write operations are carried out by an access controller. An integrated memory with implemented BIST hardware, in the case of which a comparatively high functionality and flexibility during the memory test, are nevertheless made possible.

15 Claims, 4 Drawing Sheets

INTEGRATED MEMORY AND METHOD FOR CHECKING THE FUNCTIONING OF AN INTEGRATED MEMORY

BACKGROUND OF THE INVENTION

Field of the Invention

The present invention relates to an integrated memory and to a method for checking the functioning of an integrated memory of this type.

Integrated memories, for example in the form of DRAMs (Dynamic Random Access Memories) are generally subjected to extensive functional tests in the production process. Inter alia, these functional tests serve for identifying defective memory cells or defective column lines or row lines. As the memory size increases, the costs of functional tests make up an ever-greater proportion of the total production costs for a memory. In order to lower the test costs, therefore, increasingly methods are being developed such as test modes for the compression of data, parallelization of memory accesses by using a reduced number of terminal contacts or additional test logic, for example in the form of a BIST unit (Built-In Self-Test).

With progressive development in the field of integrated memories, the operating frequency at which an integrated memory is operated generally rises continually. As operating frequencies of integrated memories increase, testing of memories becomes more difficult with respect to their functionality. In this case, in order to obtain a largely meaningful test result, it is important that the memory also be tested at its operating frequency that it has in normal operation.

However, experience shows that it is a comparatively major problem to provide test apparatuses for recent integrated memories that can assess output signals of a tested integrated memory that is tested and operated at maximum operating frequency, with sufficient accuracy at this required frequency. Often, test apparatuses of this type are not commercially available or are comparatively expensive. For cost reasons, therefore, it is often highly advantageous to use chip-associated hardware to enable test apparatuses of older configurations, which only support comparatively low frequencies, to be utilized for recent chip generations.

In this connection, test methods are known in which test apparatuses that support only comparatively low frequencies are used only for the interrogation of a so-called pass-fail information item of a functional test of a memory cell array of the memory to be tested, the functional test itself being carried out by a BIST unit. The functional test by using the BIST unit can be carried out with the specified target frequency independently of the operating frequency of a tester. The memory chip interface operated at high frequency is subsequently tested separately.

BIST units, if they are intended to have an address generation unit that is as flexible as possible, can only be realized with complex circuitry and thus in a manner that takes up a great deal of space. Therefore, it is of greater interest in this connection to control the address generation by using an externally connected and flexibly programmable test apparatus.

Previously, the aim that has primarily been pursued has been to construct test patterns with the simplest possible incremental or decremental address generation in such a way as to enable the simplest possible testability of the memory including the redundancy without complex address space calculations. Such functional tests are primarily carried out at the wafer level. However, for cost reasons, the following restrictions are implemented in this case in the generation of addressed memory accesses: only one fixedly defined address step size, only one direction of incrementing and also addressing in either the row or the column direction are supported. Furthermore, complex possibilities of jumping between the redundant memory cell area and the main cell array are not supported. The memory chip interface can usually only be configured once before the beginning of the test and cannot be reconfigured during the memory test without a great deal of time being lost.

SUMMARY OF THE INVENTION

It is accordingly an object of the invention to provide an integrated memory and a method for checking the functioning of an integrated memory that overcome the hereinafore-mentioned disadvantages of the heretofore-known devices of this general type and that provide a comparatively high functionality and flexibility during the address generation in the memory test.

With the foregoing and other objects in view, there is provided, in accordance with the invention, an integrated memory including a memory cell array, an access controller, an addressing unit, and an addressing calculation logic unit. The memory cell array is made of memory cells for storing data. The access controller is for controlling a memory access to the memory cell array for reading and/or writing data. The addressing unit is for addressing selected ones of the memory cells corresponding to the memory access based on received addressing signals. The addressing calculation logic unit is connected to the addressing unit, is activatable by a test mode signal for a test operation of the memory cell array, receives command signals and address signals for the test operation, calculates the addressing signals from the command signals and the address signals for the memory access, and feeds the addressing signals into the addressing unit.

The core of the present invention is an addressing calculation logic unit of the integrated memory. The logic unit is connected to an addressing unit for addressing memory cells for a memory access based on received addressing signals. The addressing calculation logic unit can be activated by a test mode signal for a test operation of the memory. The addressing calculation logic unit receives command signals and address signals for the test operation, calculates therefrom the addressing signals for the memory access and feeds them into the addressing unit. The addressing unit carries out the actual addressing of memory cells for the memory access during the test operation. The addressing calculation logic unit can readily be integrated into a complex BIST unit.

With the objects of the invention in view, there is also provided a method for checking an integrated memory. The method includes providing an integrated memory as described in the previous paragraph. The next step is activating the addressing calculation logic unit for a test operation by a test mode signal. The next step is initializing the integrated memory with a transfer of initial parameters to be stored into the addressing calculation logic unit. The next step is, after the initializing step, applying the command signals and the address signals for the test operation to the addressing calculation logic unit and carrying out read/write operations with the access controller.

In accordance with the method according to the invention for checking the functioning of the integrated memory, the addressing calculation logic unit is activated for the test operation by the test mode signal. Afterward, an initialization is carried out with a transfer of initial parameters to be stored into the addressing calculation logic unit. After the initialization, the command signals and address signals for the test operation are applied to the addressing calculation logic unit and corresponding read/write operations are carried out by the access controller.

With the addressing calculation logic unit according to the invention, the assumption is created that additional commands for test implementation can be provided by an external test apparatus without the hardware complexity increasing significantly for this purpose. The addressing calculation logic unit is suitable for enabling the definition of variable step sizes and jump destinations in the test implementation, as a result of which an increased functionality and flexibility during the memory test are made possible. In this case, it is possible to define respectively suitable step sizes and jump destinations during the initialization with the transfer of corresponding initial parameters. The memory test can be configured flexibly with the application of additional commands for test implementation.

The addressing calculation logic unit is preferably constructed in such a way that the calculation of the addressing signals for feeding into the addressing unit in the addressing calculation logic unit is effected within a clock cycle of a clock signal applied to the memory. This ensures rapid address calculation (so-called on-the-fly address calculation). Such address calculation suitable for a high frequency can be used not only at the wafer level but also at the component level in particular for verifying the fault coverage of a functional test carried out at the wafer level (so-called front end test).

Furthermore, the invention advantageously enables a combined or separate addressing of regular memory cell array and redundant memory cell array. In particular, for the separate addressing of redundant memory cell array, with the initialization, an address within the redundancy memory cell array is transferred as access start address to the addressing calculation logic unit.

Other features that are considered as characteristic for the invention are set forth in the appended claims.

Although the invention is illustrated and described herein as embodied in an integrated memory and a method for checking the functioning of an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
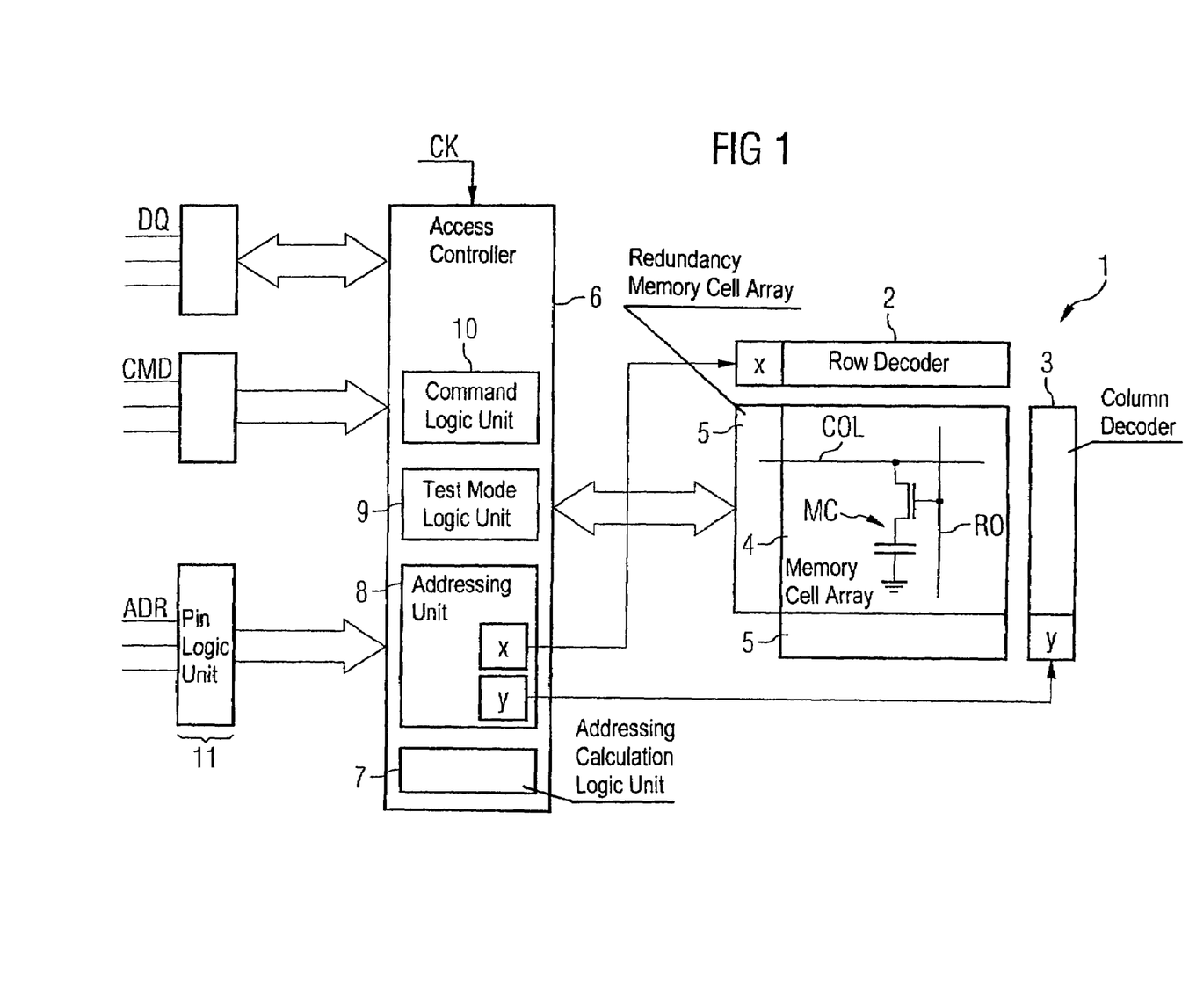
FIG. 1 is a circuit diagram showing an integrated memory according to the invention.

Referring now to the figures of the drawings in detail and first, particularly to FIG. 1 thereof, there is shown an embodiment of an integrated memory 1 according to the invention using a basic construction diagram. For driving the SDRAM illustrated in FIG. 1, terminals are provided on the module. The terminals can be divided into three groups. Address terminals ADR, command terminals CMD and data terminals DQ are provided. While the command and address terminals CMD and ADR, respectively, are pure input terminals the data terminals DQ are input and output terminals, depending on whether a write or read operation is carried out. The corresponding signals are received or output by a pin logic unit 11.

The SDRAM in accordance with FIG. 1 most importantly includes an access controller 6 and a memory cell array 4. The access controller 6 contains a plurality of logic assemblies for command interpretation and for addressing. In particular, an addressing unit 8, a test mode logic unit 9, and a command logic unit 10 are provided. With the aid of these assemblies, the access controller 6 can control a memory access to the memory cell array 4 for reading or writing data. The write or read access is initiated with an activation command of the memory cell array together with a row addressing (X addressing), and the associated column addressing (Y addressing) is then carried out together with the read or write command. In FIG. 1 and in the subsequent FIGS. 2 and 3, respective components or assemblies for X addressing and Y addressing are identified by "X" and "Y", respectively.

For the memory access, corresponding row addresses and column addresses are forwarded from the addressing unit 8 to a row decoder 2 and column decoder 3, respectively, which select the corresponding addressed memory cells MC of the memory cell array 4 and/or redundancy memory cell array 5. In this case, the memory cells MC are disposed at crossover points of row lines RO and column lines COL. The memory access is effected in synchronization with a clock signal CK present at the access controller 6. The memory 1 additionally has an addressing calculation logic unit 7, the construction and method of operation of which will be explained in more detail in connection with FIGS. 2 to 5.

Figure 2:
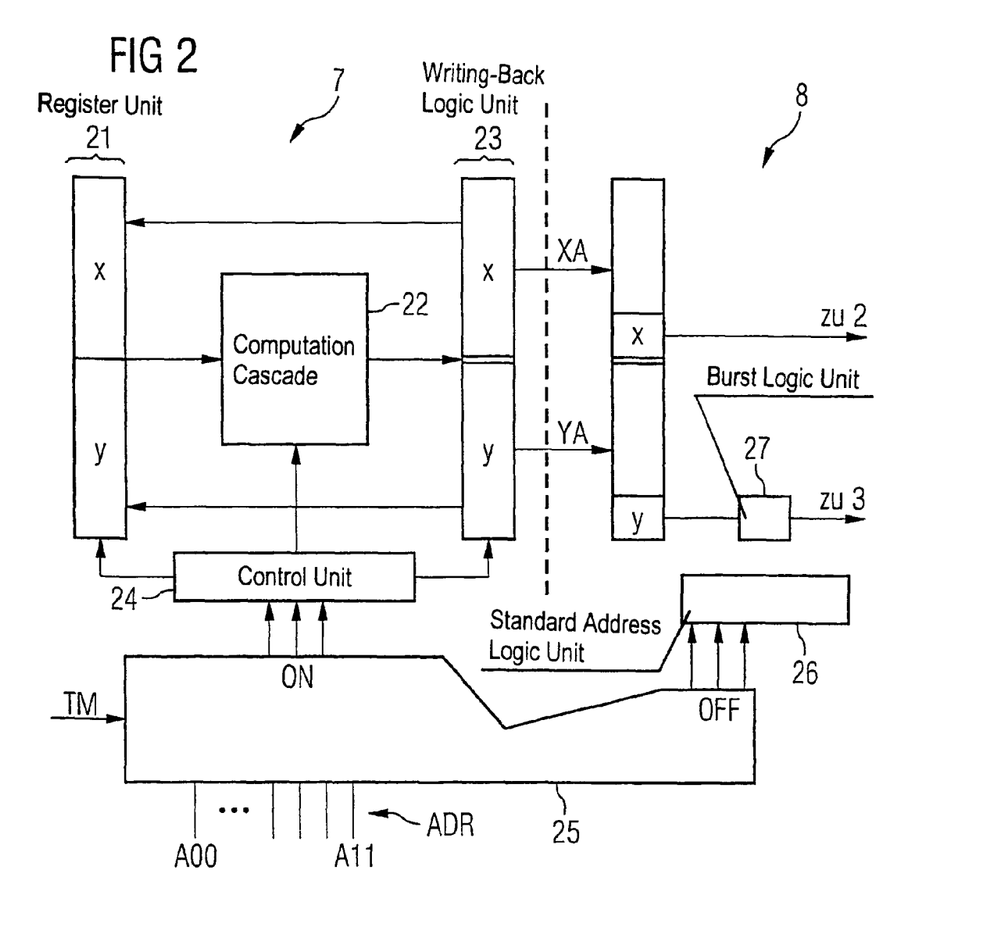
FIG. 2 is a circuit diagram showing an addressing unit and of an addressing calculation logic unit.

FIG. 2 illustrates an embodiment of an addressing unit 8 and of an addressing calculation logic unit 7. The addressing unit 8 contains standard components that take account of the addressing specification of the memory. It serves, in particular, for addressing memory cells for the memory access based on received addressing signals XA and YA. The addressing calculation logic unit 7 is connected to the addressing unit 8. The logic unit can be activated for a test operation of the memory by a test mode signal TM by using a test mode logic unit 25. The test mode logic unit 25 is preferably connected to the signal lines A00 to A11 at the address terminals ADR. The number of address terminals will generally exceed this number, this depending primarily on the storage density. In order to be able to code as much additional functionality as possible, preferably all the available address, command and/or data pins are recoded.

Via these signal lines, in the test operation, combined command signals and address signals for the test operation are received and forwarded to the addressing calculation logic unit 7. The test mode logic unit 25 is in the "On" state in this case. The addressing calculation logic unit 7 receives the combined command signals and address signals present on the signal lines A00 to A11, calculates therefrom the addressing signals XA and YA for the memory access and feeds them into the addressing unit 8. The latter drives the row decoder 2 and column decoder 3 in a corresponding manner. In this case, an additional burst logic unit 27 is provided in the Y addressing path in the addressing unit 8.

In normal operation, the test mode logic unit 25, under the control of the test mode signal TM, is in the "Off" state. In this case, the standard address logic unit 26 of the addressing unit 8, in other words the addressing unit 8, is driven directly for carrying out a standard addressing process for a memory access in normal operation. In this mode, the signal lines A00 to A11 are provided for transferring pure address signals.

The addressing calculation logic unit 7 includes a register unit 21 for storing address parameters that are required for the subsequent calculation of the addressing signals XA and YA. Connected downstream of the register unit 21 is a computation cascade 22, which carries out the actual calculation of the addressing signals. A comparison and writing-back logic unit 23 serves for writing back present addressing signals to the register unit 21. A control unit 24 is provided for controlling the calculation process and for feeding initialization values into the register unit 21 and into the computation cascade 22, the control unit being connected to the register unit 21, the computation cascade 22, and the comparison and writing-back logic unit 23. The control unit 24 receives the combined command and address signals that are received via the test mode logic unit 25 and are present at the address terminals ADR. The addressing calculation logic unit 7 is constructed in such a way that the calculation of the addressing signals XA and YA in the addressing calculation logic unit is effected within a clock cycle of the clock signal CK. The addressing calculation logic unit 7 can be used both for calculating row addresses and for calculating column addresses.

Figure 3:
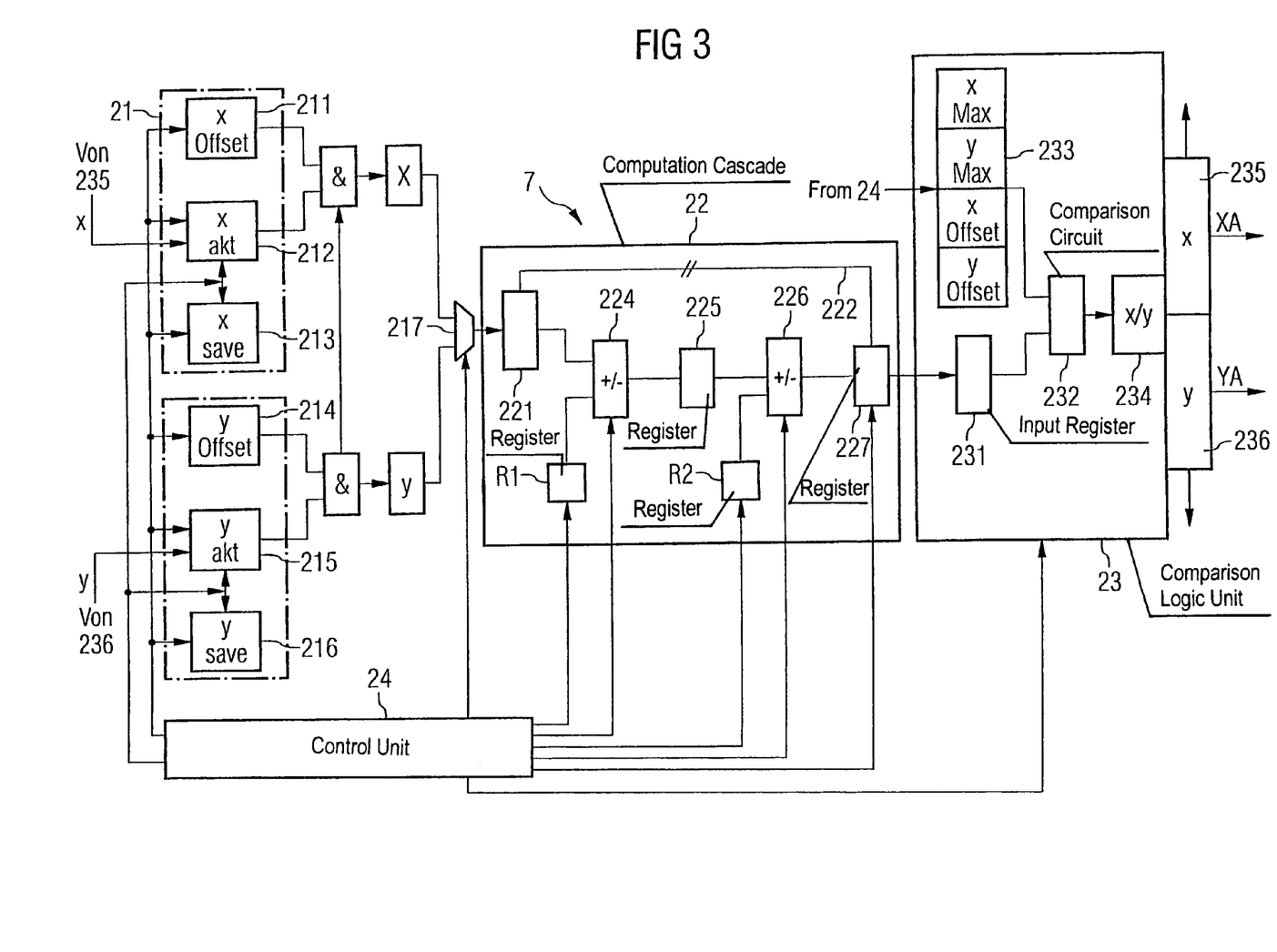
FIG. 3 is a detailed view of the embodiment of the addressing calculation logic unit shown in FIG. 2.

FIG. 3 illustrates a more detailed embodiment of an addressing calculation logic unit 7. The register unit 21 contains an offset register 211 for storing a row access start address XOffset and a register 212 for storing a present access address Xakt. Furthermore, provision is made of a backup register 213 for storing an address Xsave in the form of an address marker. Corresponding registers 214 to 216 are also present for the column addressing. The registers 211 and 212, and respectively 214 and 215, are connected to a multiplexer 217 via respective adders and intermediate registers. Both the adders and the multiplexer 217 can be controlled by the control unit 24. The exchange of the address parameters of the backup registers 213, 216 with the registers 212, 215 is likewise controllable. The registers 211 to 216 are set during an initialization with a respective initial parameter. Via the multiplexer 217, respective address parameters for the row addressing and column addressing are output to the computation cascade 22.

The computation cascade 22 includes registers R1 and R2 for defining step sizes and jump destinations during the address calculation. For this purpose, a corresponding parameter value is stored in the registers R1 and R2. The computation cascade 22 receives, via the input register 221, the address parameter value output by the register unit 21. The value is fed together with the register value of the register R1 to an addition unit 224. The addition unit 224 can be an adder for adding and/or a subtracter for subtracting. An intermediate result of the addition and/or subtraction is buffer-stored in the register 225. The intermediate result is fed together with the register value of the register R2 to an adder/subtracter 226, and the result of this addition and/or subtraction is stored in the output register 227.

The address received from the register unit 21 is modified in this way. Furthermore, the computation cascade 22 has a bypass 222 in order to output the received address unchanged. The computation cascade 22 in accordance with the present exemplary embodiment contains two registers R1, R2 and parallel adders/subtracters 224, 226, at least one register and, respectively, adder/subtracter having to be provided in accordance with the concept according to the invention. The configuration of a plurality of registers in the computation cascade 22 has the advantage that different step sizes and jump destinations during the address calculation can be realized with greater flexibility.

By using corresponding control signals of the control unit 24, it is possible to decide which of the registers R1, R2 are employed for the calculation of modified address signals or whether the components 224 and 226 function as adders or subtracters. Furthermore, the control unit 24 can control whether the address value stored in the input register 221 is forwarded directly to the output register 227.

Connected downstream of the computation cascade 22 is a comparison logic unit 23, which has a register circuit 233 for storing predetermined maximum values XMax and YMax for the row addressing and column addressing, respectively. Furthermore, the values XOffset and YOffset are stored in the register circuit 233. The value output by the computation cascade 22 is stored in the input register 231. A comparison circuit 232, optionally controlled by the control unit 24, compares the values XMax and YMax of the configurable register circuit 233 with the value of the input register 231. The address of the input register 231 is modified depending on the comparison result. In the case of an address range having the size of an integer power n of two, the address range delimitation of 0 to $2^n-1$ can be effected by simple AND operation with a range mask Xmask or Ymask. A flexible, virtually ideal "address range filtering" (restriction in the event of range overflow/underflow) of non-even-numbered or incompletely even-numbered binary address width is achieved by a comparison logic unit 23.

The possibly modified address value is stored in the output register 234 and fed into the respective X addressing path and Y addressing path for forwarding to the addressing unit 8. Via feedback registers 235 and 236, the present addressing signals are written back to the registers 212, 215 of the register unit 21 provided for them.

The interconnection of register unit 21, computation cascade 22 and comparison and writing-back logic unit 23 in conjunction with the feedback loop is constituted such that all parallel additions in a plurality of stages together with the comparison calculations can be processed within a clock cycle and be used for the subsequent address calculation in the next clock cycle. The address calculation for the X addressing and Y addressing is carried out serially in accordance with the addressing order for accessing the memory cell array of the memory, during which firstly the rows and then the columns are addressed.

At the beginning of the operation of the addressing calculation logic unit 7, the latter has to be initialized with suitable initial parameters. The initialization includes configuring the register unit, configuring the registers that can be employed for the calculation in the computation cascade, and loading register values in the comparison and writing-back logic unit.

The method of operation of the addressing calculation logic unit 7 is described in more detail below.

The addressing calculation logic unit is activated once by the call-up of a test mode by the test mode signal TM. This test mode remains active until the disconnection of the power supply or is canceled by a corresponding address calculation control mode. The addressing calculation logic unit is advantageously constructed in such a way that a renewed loading or reconfiguration of registers is not necessary.

The addressing calculation logic unit is initialized either by parallel, parallel-serial, or purely serial transfer of register values to be stored via the address pins. In this case, the registers can be set row-wise in one or a plurality of subsequent clock cycles. 2-clock-cycle transfer is preferably chosen, in which the register to be written to is addressed in the first clock cycle and the respective parameter values are transferred in parallel or serially in the second or subsequent clock cycle. In the case of an address bus having a width of 10 bits, 1024 registers can be selected and configured in the case of 2-word transfer. All the registers contained in the addressing calculation logic unit are adapted in terms of their address width to the memory cells to be addressed. An additional register set for addressing a memory bank (so-called Z addressing) is conceivable in this case. A special reset command is advantageously provided, which can reset all the registers to correspondingly desired values in one clock cycle. The initialization process could thus be shortened appreciably.

After the configuration of the registers, read/write operations can be initiated externally in the test operation via the command terminals. In the test mode, combined command and address signals are applied to the address terminals, in contrast to a mode of operation in normal operation, the addressing calculation logic unit calculating test-mode-specific addresses from the signals.

The table below lists exemplary, non-exhaustive commands that are available for a test operation. Only X address commands are listed in this case, which commands also exist analogously for the Y addressing and Z addressing.

| | Clock cycles | Meaning |
|---|---|---|
| Reset | 1 | Reset address logic unit |
| ExitTestMode | 1 | Deactivate address logic unit |
| LoadReg n, m | 2 | Load register n with the value m |
| AddXOffsetToXakt | 1 | Add the offset to the present X-addr |
| MoveXaktToRn | 1 | Copy Xakt to register Rn |
| MoveXaktToXSave | 1 | Copy Xakt to Xsave |
| MoveXSaveToXakt | 1 | Copy Xsave to Xakt |
| MoveXaktToXMax | 1 | Copy Xakt to Xmax |
| XALUSubn | 1 | Subtract all registers Rn from Xakt depending on bit status of Argument1. Argument1 specifies the register selection. |
| XALUAddn | 1 | Add all registers Rn to Xakt depending on bit status of Argument1. Argument1 specifies the register selection. |
| XALUn,x | 1 | Add/subtract all registers to/from Xakt depending on bit status of Argument1 and Argument2. Argument1 specifies the register selection. Argument2 specifies addition (=0) or subtraction (=1) during the register selection. |

An exemplary address coding table for an addressing calculation logic unit with three registers R1, R2, R3 in the computation cascade and a respective Offset, Max, and Save register for X addressing and Y addressing is presented below.

| | Command coding | | | | | | Argument 2 | | | Argument 1 | | |
|---|---|---|---|---|---|---|---|---|---|---|---|---|
| Command | A11 | A10 | A09 | A08 | A07 | A06 | A05 | A04 | A03 | A02 | A01 | A00 |
| Reset | 0 | 0 | 0 | 0 | 0 | 0 | | | | | | |
| ExitTestMode | 1 | 1 | 1 | 1 | 1 | 1 | | | | | | |
| LoadReg n, m | 0 | 0 | 0 | 0 | 0 | 1 | m2 | m1 | m0 | R3 | R2 | R1 |
| AddXOffToXakt | 0 | 0 | 0 | 0 | 0 | 1 | | | | | | |
| MoveXaktToRn | 0 | 0 | 0 | 0 | 1 | 0 | | | | R3 | R2 | R1 |
| MoveXaktToXSave | 0 | 0 | 0 | 0 | 1 | 1 | | | | | | |
| MoveXSaveToXakt | 0 | 0 | 0 | 1 | 0 | 0 | | | | | | |
| MoveXaktToXMax | 0 | 0 | 0 | 1 | 0 | 1 | | | | | | |
| AddYOffToXakt | 1 | 0 | 0 | 0 | 0 | 1 | | | | | | |
| MoveYaktToRn | 1 | 0 | 0 | 0 | 1 | 0 | | | | R3 | R2 | R1 |
| MoveYaktToXSave | 1 | 0 | 0 | 0 | 1 | 1 | | | | | | |
| MoveYSaveToXakt | 1 | 0 | 0 | 1 | 0 | 0 | | | | | | |
| MoveYaktToXMax | 1 | 0 | 0 | 1 | 0 | 1 | | | | | | |
| XALUSubn | 0 | 1 | 0 | 0 | 0 | 0 | | | | R3 | R2 | R1 |
| XALUAddn | 0 | 1 | 0 | 0 | 0 | 0 | | | | R3 | R2 | R1 |
| XALUn, x | 0 | 1 | 0 | 0 | 0 | 0 | x2 | x1 | x0 | R3 | R2 | R1 |
| YALUSubn | 1 | 0 | 0 | 0 | 0 | 0 | | | | R3 | R2 | R1 |
| YALUAddn | 1 | 0 | 0 | 0 | 0 | 0 | | | | R3 | R2 | R1 |
| YALUn, x | 1 | 0 | 0 | 0 | 0 | 0 | x2 | x1 | x0 | R3 | R2 | R1 |

By way of example, the performance of the specific operational sequence "ACT x+1/WR Y+1" is explained below.

This means that rows are successively addressed and activated with step size 1 and columns are likewise written to successively with step size 1. After the initialization of the memory, during which the value 1 has been stored in the register R1, the following command sequence is applied to the command terminals and address terminals:

ACT XALUAdd1/WR YALUAdd1.

Generally, the calculation logic unit can calculate the next valid X address from the present X address Xakt, the register values of the registers Rx, the offset value Xoffset, and XMax in accordance with $$Xakt = Xakt + \sum_{x=1,2,...} Rx$$

If $XOffset < Xakt + \sum_{x=1,2,...} Rx < X\max$ $$Xakt = Xakt + \sum_{x=1,2,...} Rx - (X\max - XOffset)$$

If $Xakt + \sum_{x=1,2,...} Rx > X\max$ $$Xakt = Xakt + \sum_{x=1,2,...} Rx + (X\max - XOffset)$$

If $Xakt + \sum_{x=1,2,...} Rx < XOffset$

The same results correspondingly for the Y address calculation. The above calculation equations require at least three calculations in the case of a single-stage computation cascade, the greater than/less than comparison already implicitly being present by virtue of an addition/subtraction. With correspondingly chosen X-Y offset register values, it is possible to determine whether a regular cell array pass with overflow automatic system, a pass through an area of the cell array with overflow automatic system, a pass through the redundancy cell array with overflow automatic system or a pass through an area of the redundancy cell array with overflow automatic system is carried out. The X/Y offset values and X/YMax values are chosen correspondingly for this. In this case, the register value Rx specifies the step size and step direction.

Figure 4:
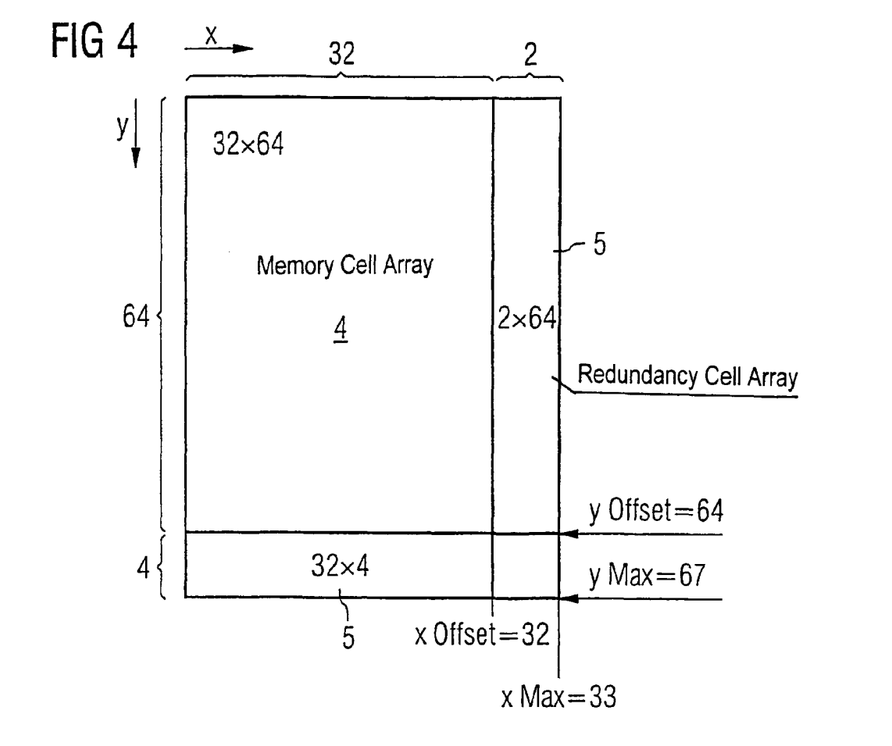
FIG. 4 is a diagrammatic plan view showing a memory cell array of the memory being subjected to a functional test.

FIGS. 4 and 5 show a diagrammatic illustration of a memory cell array 4 and of a redundancy memory cell array 5 with an exemplary number of rows and columns. The memory cell array 4 has 32 rows and 64 columns. Accordingly, 32×64 memory cells are configured in the memory cell array 4. The size of the X redundancy memory cell array is 2×64, and the size of the Y redundancy memory cell array is 32×4.

Four examples of an addressing pass for a test operation are explained below in connection with FIG. 5.

Figure 5A:
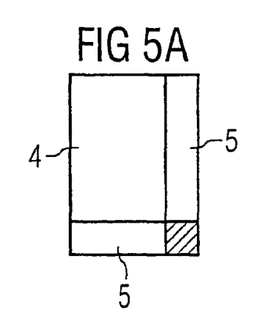
FIGS. 5A–5D show diagrammatic illustrations of the memory cell array according to FIG. 4 in different test sequences.

FIG. 5A shows an addressing pass through the X-Y redundancy memory cell array with step size +1 (cell array shown hatched). For this purpose, the following start parameters are chosen for the addressing calculation logic unit during the initialization:
XOffset=32
YOffset=64
Xakt=XOffset
Yakt=YOffset
XMax=33
YMax=67
R1=+1

Figure 5B:
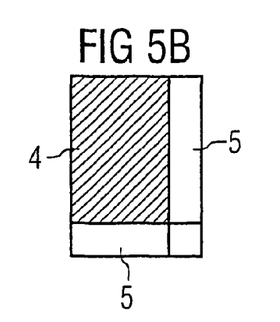

FIG. 5B illustrates an addressing pass through the regular memory cell array 4 with step size +2. In this case, the following start parameters are set:
XOffset=0
YOffset=0
Xakt=XOffset
Yakt=YOffset
XMax=31
YMax=63
R1=+2

Figure 5C:
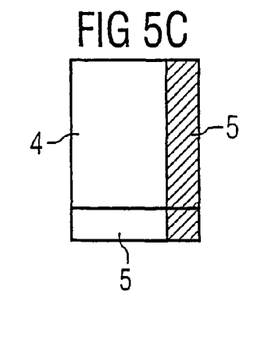

FIG. 5C shows an addressing pass through the X redundancy memory cell array with step size −1. In this case, the following start parameters are set:
XOffset=32
YOffset=0
Xakt=XOffset
Yakt=YOffset
XMax=33
YMax=67
R1=−1

Figure 5D:
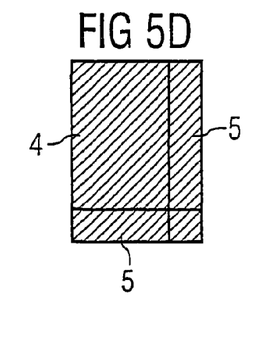

FIG. 5D illustrates an addressing pass through the complete memory cell array with step size −2. In this case, the following start parameters are chosen:
XOffset=0
YOffset=0
Xakt=XOffset
Yakt=YOffset
XMax=33
YMax=67
R1=−2

We claim:

1. An integrated memory, comprising:
a memory cell array of memory cells for storing data;
an access controller for controlling a memory access to said memory cell array for at least one of reading and writing data;
an addressing unit for addressing selected ones of said memory cells corresponding to the memory access based on received addressing signals; and
an addressing calculation logic unit connected to said addressing unit, to be activated by a test mode signal for a test operation of said memory cell array, receiving command signals and address signals for the test operation, calculating the addressing signals from the command signals and the address signals for the memory access, and feeding the addressing signals into said addressing unit, said addressing calculation logic unit including:
a register unit for storing address parameters for calculating the addressing signals;
a computation cascade connected downstream of said register unit and calculating the addressing signals;
a writing-back logic unit connected downstream of said computation cascade and writing back present addressing signals to said register unit; and
a control unit connected to said register unit and said computation cascade for controlling a calculation process and for feeding initialization values.

2. The integrated memory according to claim 1, further comprising signal lines receiving signals selected from the group consisting of address signals, command signals, and data signals, during normal operation;
said addressing calculation logic unit receiving the command signals and the address signals for the test operation via said signal lines.

3. The integrated memory according to claim 1, wherein:
the memory access is synchronized with a clock signal; and
said addressing calculation logic unit calculates the addressing signals in said addressing calculation logic unit within one clock cycle.

4. The integrated memory according to claim 1, wherein said addressing calculation logic unit has a register for defining at least one of step sizes and jump destinations during the address calculation.

5. The integrated memory according to claim 1, wherein said register unit includes an offset register for storing an access start address, a register for storing a present access address, said register unit outputting the present access address to said computation cascade.

6. The integrated memory according to claim 5, further comprising a redundancy memory cell array;
the access start address stored in said offset register being within said redundancy memory cell array.

7. The integrated memory according to claim 1, wherein said computation cascade receives an address of said register unit, has a register for storing a parameter value, has an addition unit for adding the parameter value to the received address to form a modified address and outputs the modified address, has a bypass with respect to said addition unit for outputting the received address unchanged.

8. The integrated memory according to claim 7, wherein said addition unit is at least one of an adder for adding and a subtracter for subtracting.

9. The integrated memory according to claim 7, wherein said control unit controls when the received address is modified.

10. The integrated memory according to claim 7, wherein said control unit controls when addition of at least one of the parameter values is effected.

11. The integrated memory according to claim 7, wherein said control unit controls when subtraction of at least one of the parameter values is effected.

12. The integrated memory according to claim 7, further comprising a comparison logic unit connected downstream of said computation cascade for comparing a predetermined maximum value of an address with an output address of said computation cascade; the output address being fed in modified form into said addressing unit for the memory access depending on a comparison result.

13. An integrated memory, comprising:
a memory cell array of memory cells for storing data, said memory cell array having rows and columns with said memory cells disposed at crossover points of said rows and columns;
an access controller for controlling a memory access to said memory cell array for at least one of reading and writing data;
an addressing unit for addressing selected ones of said memory cells corresponding to the memory access based on received addressing signals; and
an addressing calculation logic unit connected to said addressing unit, to be activated by a test mode signal for a test operation of said memory cell array, receiving command signals and address signals for the test operation, calculating the addressing signals from the command signals and the address signals for the memory access, and feeding the addressing signals into said addressing unit; said addressing calculation logic unit including:
a register unit with separate registers in each case for storing row and column address parameters for calculating row addresses and column addresses;
a multiplexer connected to said register unit;
a computation cascade connected downstream of said register unit via said multiplexer and serially calculating the row and column addressing signals;
a writing-back logic unit connected downstream of said computation cascade and serving for respectively writing back present row and column addressing signals to said register unit; and
a control unit connected to said register unit and said computation cascade for controlling a calculation process and for feeding in initialization values.

14. A method for checking an integrated memory, which comprises:
providing an integrated memory according to claim 1;
activating the addressing calculation logic unit for a test operation by a test mode signal;
initializing the integrated memory with a transfer of initial parameters to be stored into the addressing calculation logic unit; and
after the initializing step, applying the command signals and the address signals for the test operation to the addressing calculation logic unit and carrying out read/write operations with the access controller.

15. The method according to claim 14, which further comprises, with the initializing, transferring an address within a redundancy memory cell array as an access start address to the addressing calculation logic unit.

* * * * *